(12) United States Patent
Bronner et al.

(10) Patent No.: US 6,258,689 B1
(45) Date of Patent: Jul. 10, 2001

(54) LOW RESISTANCE FILL FOR DEEP TRENCH CAPACITOR

(75) Inventors: Gary B. Bronner, Stormville, NY (US); Jeffrey P. Gambino, Gaylordsville, CT (US); Jack A. Mandelman, Stormville, NY (US); Rick L. Mohler, Williston, VT (US); Carl Radens, Poughkeepsie, NY (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/626,328

(22) Filed: Jul. 26, 2000

Related U.S. Application Data

(62) Division of application No. 09/135,744, filed on Aug. 18, 1998.

(51) Int. Cl.[7] .................................................. H01L 21/20
(52) U.S. Cl. ........................... 438/386; 438/243; 438/246; 438/362; 437/300; 257/61; 257/301; 257/304; 257/516
(58) Field of Search .................................. 438/386, 243, 438/362, 246; 437/300; 257/301, 516, 304, 61

(56) References Cited

U.S. PATENT DOCUMENTS

| | | | |
|---|---|---|---|
| 4,619,039 | * 10/1986 | Maas et al. | 29/591 |
| 4,649,625 | 3/1987 | Lu | 166/270 |
| 4,812,417 | * 3/1989 | Hirao | 437/31 |
| 4,853,348 | * 8/1989 | Tsubouchi et al. | 437/203 |
| 4,954,855 | * 9/1990 | Mimura et al. | 357/23.7 |
| 5,283,453 | 2/1994 | Rajeevakumar | 257/304 |
| 5,336,912 | * 8/1994 | Ohtsuki | 257/304 |
| 5,451,809 | 9/1995 | Shiozawa et al. | 257/516 |
| 5,521,114 | * 5/1996 | Rajeevakumar | 437/60 |
| 5,555,520 | 9/1996 | Sudo et al. | 365/149 |
| 5,658,816 | 8/1997 | Rajeevakumar | 438/386 |
| 5,692,281 | 12/1997 | Rajeevakumar | 29/25.42 |
| 5,827,765 | 10/1998 | Stengl et al. | 438/243 |
| 5,905,279 | * 5/1999 | Nitayama et al. | 257/301 |

FOREIGN PATENT DOCUMENTS 362040759   2/1987   (JP).

* cited by examiner

*Primary Examiner*—Richard Elms
*Assistant Examiner*—Pho Luu
(74) *Attorney, Agent, or Firm*—Scully, Scott, Murphy & Presser; Steven Capella, Esq.

(57) ABSTRACT

Trench capacitors are fabricated utilizing a method which results in a metallic nitride as a portion of a node electrode in a lower region of the trench. The metallic nitride-containing trench electrode exhibits reduced series resistance compared to conventional trench electrodes of similar dimensions, thereby enabling reduced ground rule memory cell layouts and/or reduced cell access time. The trench capacitors of the invention are especially useful as components of DRAM memory cells having various trench configuration and design.

19 Claims, 3 Drawing Sheets

LOW RESISTANCE FILL FOR DEEP TRENCH CAPACITOR

This application is a divisional of U.S. application Ser. No. 09/135,744, filed Aug. 18, 1998.

FIELD OF THE INVENTION

The present invention relates to the manufacture and design of trench capacitors for integrated circuit devices, especially capacitors for use in dynamic random access memory (DRAM) cells and advanced memory devices containing the same.

BACKGROUND OF THE INVENTION

Generally, a semiconductor memory device such as a dynamic random access memory (DRAM) cell comprises a plurality of memory cells which are used to store large quantities of information. Each memory cell typically includes a capacitor for storing electric charge and a field effect transistor (FET) for opening and closing charge and discharge passages of the capacitor. The number of cells (and corresponding bits of memory capacity) of DRAM integrated circuit chips has been increasing by approximately 4x every three years; this has been achieved by reducing memory cell size. Unfortunately, the smaller memory cell size also results in less area to fabricate the capacitor.

Moreover, as DRAM cell dimensions are scaled down with each successive generation, the cross-sectional area of the deep trench storage capacitor diminishes inversely with the square of the ground rule, while the trench depth has remained approximately constant. This change in trench geometry results in a large increase in the series resistance contributed by the polysilicon electrode contained within the deep trench. The increased series resistance, in turn, may adversely limit the speed at which the corresponding memory cell can be accessed.

One approach known in the prior art to decrease the series resistance of DRAM trench capacitors is to increase the doping concentration of the deep trench polysilicon. This approach however only provides a marginal reduction in series resistance and thus has limited applicability in fabricating DRAM cells of decreased dimension.

In view of the state of the prior art, there is a continued need for new manufacturing processes and/or designs which more effectively address the problem of series resistance in the context of trench capacitors and devices incorporating such capacitors, e.g. DRAM chips.

SUMMARY OF THE INVENTION

The present invention provides trench capacitor structures and methods of fabricating trench capacitors wherein the distributed series resistance of the deep trench electrode is substantially reduced for a given geometry.

The present invention also provides trench capacitor structures and methods of fabricating trench capacitors wherein the capacitance of the deep trench electrode is substantially increased for a given trench geometry.

The present invention further provides a trench capacitor structure which can be used in conventional DRAM memory cells as well as advanced memory cell devices.

In one aspect, the present invention encompasses a process wherein a metallic nitride liner is formed in the lower trench region of a deep trench capacitor. Specifically, the process of the present invention comprises:

(a) providing a semiconductor substrate having (i) a deep trench region therein, said deep trench having an upper region and a lower region, (ii) at least one pad layer formed on a surface of said semiconductor substrate, said pad layer being adjacent to said deep trench region, (iii) a first node electrode in said semiconductor substrate about said lower region of said deep trench, and (iv) a conformal node dielectric lining said deep trench at said first node electrode and overlying said pad layer;

(b) forming a layer of doped polysilicon on said node dielectric;

(c) forming a layer of a metallic nitride on said layer of doped polysilicon;

(d) planarizing the structure resulting from step (c) stopping at said pad layer;

(e) removing said node dielectric, said layer of doped polysilicon and said metallic nitride from a portion of said upper region of said deep trench to form a recess;

(f) filling said recess formed in step (e) with amorphous silicon; and (g) planarizing said structure formed in step (f) stopping at said pad layer.

In one embodiment of the present invention, the deep trench is a bottle-shaped trench having a narrow upper region and a broad lower region. Such bottle-shaped trenches can be formed by an isotropic etch process which selectively removes material in the lower region of the deep trench but not the upper region of the deep trench.

Another aspect of the present invention relates to a deep trench capacitor structure having a metallic nitride in the lower region of the deep trench. It should be noted that the term "deep trench" is preferably used herein to denote a trench having a depth of from about 3 to about 10, more preferably 6–8, $\mu$m. The capacitor structure of the present invention comprises (a) a semiconductor substrate having a deep trench region therein; (b) a first node electrode in said semiconductor substrate about the exterior of said deep trench region; (c) a node dielectric layer lining said trench and covering said first node electrode; (d) a second node electrode comprising a layer of doped polysilicon conformal to an interior wall of said trench over said node dielectric and a layer of a metallic nitride material conformal to an interior wall of said doped polysilicon.

In a preferred embodiment of the present invention, the deep trench is a bottle-shaped trench having a narrow upper region and a broad lower region.

A further aspect of the present invention is directed to advanced memory cell devices which contain at least the DRAM cell structure of the present invention as one of its components.

These as well as other aspects of the present invention are described in greater detail below.

DETAILED DESCRIPTION OF THE INVENTION

Figure 1A:
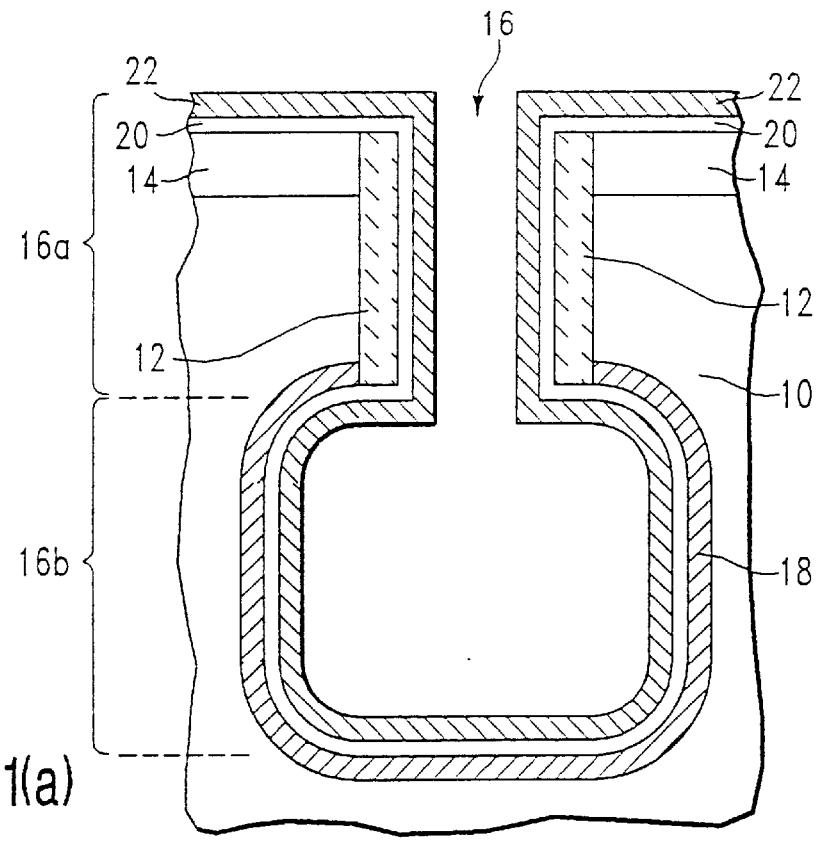
FIGS. 1(*a*)–(*e*) are schematic cross-sectional views of a bottle-shaped storage trench capacitor structure containing a metallic nitride material as part of the second node electrode which is formed from the processing steps of the present invention.

The present invention will now be described in greater detail by referring to the drawings that accompany this application. It should be understood that the present invention is not limited to the specific structures illustrated in the drawings. While the drawings illustrate a bottle-shaped trench, the present invention may be practiced using trenches of other shapes and/or geometries as well as employing alternative techniques as described below. It should also be understood that the present invention is not limited to any specific dopant type provided that the dopant types selected for the various components are consistent with the intended electrical operation. Moreover, it should not noted that the dopant types of the various doped layers should be the same as the source-drain diffusion of the array MOSFET.

FIGS. 1(a)–(e) show various processing steps that may be employed in the present invention for fabricating a DRAM cell capacitor structure of the present invention. Specifically, FIG. 1(a) shows a cross-sectional view of an initial bottle-shaped trench structure that is employed in step (a) of the present invention. The bottle-shaped trench structure shown in FIG. 1(a) comprises a semiconductor substrate 10 and one or more pads layers 14. For example, pad layer 14 may be composed of an oxide pad, e.g. $SiO_2$, a polish stop pad such as $Si_3N_4$, or a combination thereof. When a combination of pad layers is employed, it is preferred that the oxide pad be formed directly on the semiconductor substrate utilizing a conventional deposition or thermal oxide growing process and then the polish stop pad be formed over the oxide pad by conventional deposition processes including chemical vapor deposition (CVD), plasma-assisted chemical vapor deposition, sputtering and other like deposition processes. The various pad layers act as a protective layer during a subsequent etch step used to form trench 16.

As shown in the drawings, trench 16 preferably has a narrow upper region 16a and a broad lower region 16b. Other trench configurations besides the bottle-shaped one illustrated in the drawings are also contemplated herein. Thus, it is also within the scope of the present invention to provide a deep trench which has the same widths at both the upper and lower regions.

Semiconductor substrate 10 may be formed from any conventional semiconducting material, including, but not limited to: Si, Ge, GaP, InAs, InP, SiGe, GaAs or other III/V compounds. Of these semiconducting materials, it is highly preferred that semiconductor substrate 10 be composed of Si.

At broad lower region 16b, there is also shown a first node electrode 18 such as a buried plate out-diffused region and a node dielectric layer 20. The node electrode is located within semiconductor substrate 10 and it is about the exterior of the trench. The node dielectric, on the other hand, lines the interior of the trench. Narrow upper region 16a, preferably contains an oxide collar 12 which may be formed by local oxidation of silicon (LOCOS) or any other technique.

The node dielectric material which comprises a material such as silicon nitride is deposited into the trench as well as on the exposed surface of pad layers 14 using conventional deposition processes including but not limited to: chemical vapor deposition, low pressure chemical vapor deposition, plasma assisted chemical vapor deposition and other like deposition techniques. The surface of the node dielectric layer is typically oxidized using well known oxidation conditions. The thickness of the node dielectric may vary depending on the ground rule of the memory device being fabricated. Typically, the thickness of the node dielectric layer is from about 2 to about 6 nm.

The initial bottle-shaped structure shown in FIG. 1(a) can be fabricated using conventional techniques that are well known to those skilled in the art. For example, the bottle-shaped trench structure of FIG. 1(a) can be fabricated using the processes disclosed in U.S. Pat. No. 4,649,625 to Lu; U.S. Pat. No. 5,658,816 to Rajeevakumar; and U.S. Pat. No. 5,692,281 to Rajeevakumar, the contents of each being incorporated herein by reference. The first node electrode, i.e. buried plate, may be formed by any conventional technique of diffusing the appropriate conductivity type dopant through the trench wall, See for example, the technique described in U.S. Pat. No. 5,395,786, the disclosure of which is incorporated herein by reference.

After providing the above described structure, a doped polysilicon layer 22 is formed over node dielectric 20, see FIG. 1(a). The doped polysilicon layer serves as a buffer between node dielectric 20 and metallic nitride layer 24 (to be deposited next). The doped polysilicon layer is preferably a heavily doped layer which contains from about $1 \times 10^{18}$ to about $1 \times 10^{21}$ atoms/cm$^3$ of a dopant atom. The specific dopant employed is the same type as that used in forming the source/drain diffusion regions. Doped polysilicon layer 22 is formed by a conventional deposition process such as CVD which is capable of forming a conformal layer.

Figure 1B:
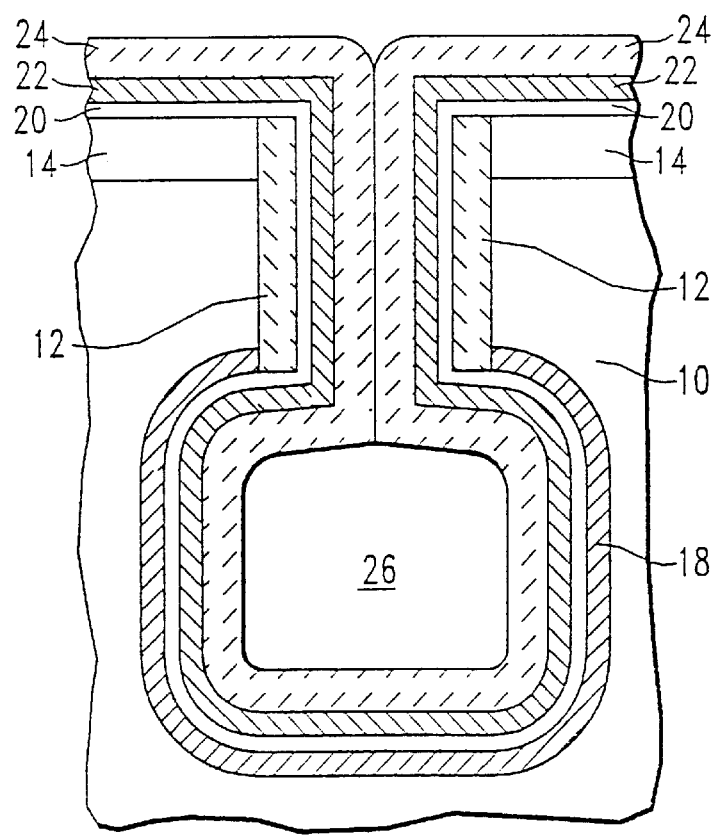

In accordance with the next step of the present invention and as is also shown in FIG. 1(b), a metallic nitride layer 24 is formed over the entire surface of doped polysilicon layer 22. The metallic nitride layer employed in the present invention is composed of any metallic nitride which is capable of withstanding the hot processing steps which are customarily used in DRAM manufacturing. Moreover, the metallic nitride layer is composed of a material which does not react with, nor degrade the node dielectric layer. In accordance with the present invention, the metallic nitride material employed preferably has a resistivity of from about 1 to about 1000 $\mu$ohm-cm. More preferably, the material employed in the present invention in forming metallic nitride layer 24 has a resistivity as low as possible. Suitable materials which can be employed as the metallic nitride layer include, but are not limited to: TiN, TaN, TaSiN and WN. A highly preferred material utilized in forming metallic nitride layer 24 is TiN.

The metallic nitride layer is formed on the surface of doped polysilicon 22 preferably by using a conventional deposition process which is capable of providing a conformal layer of the same. Suitable deposition processes include, but not limited to: chemical vapor deposition and low pressure chemical vapor deposition. It should be noted that metallic nitride layer 24 together with doped polysilicon layer 22 form the second node electrode of the trench capacitor structure.

In one embodiment of the present invention, the deposition processes employed in forming metallic nitride layer 24 are such that void 26 is formed in the lower region of the trench. If the deposition conditions selected do not result in the formation of a void, a void may be formed or expanded using an etching technique as described in U.S. Pat. No. 5,692,281, after the first planarization step mentioned below. It should be understood that although FIG. 1(b) shows the void being present, trench capacitor structures not containing the void are also contemplated herein.

Figure 1C:
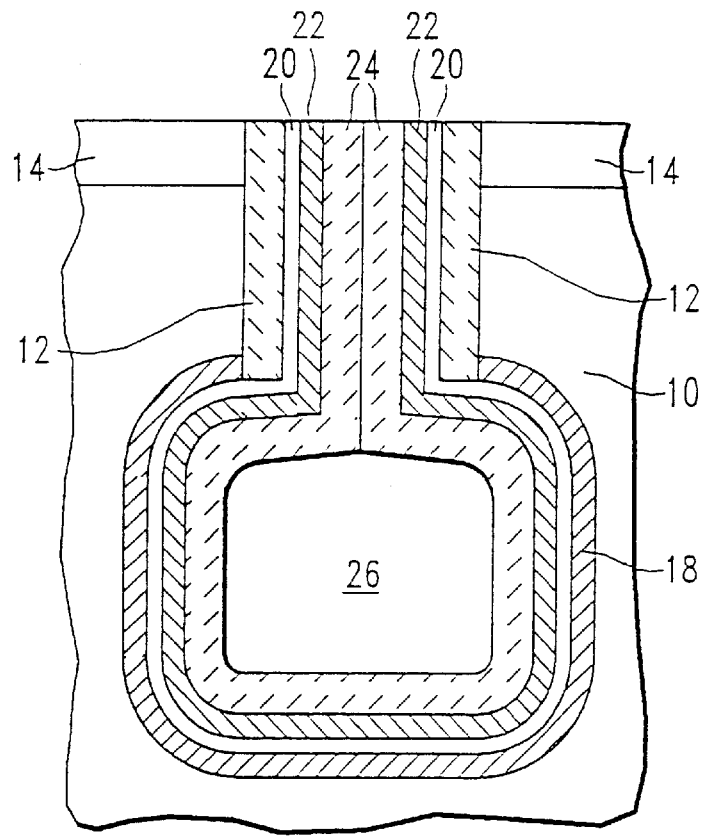

The structure of FIG. 1(b) is then planarized using conventional planarization techniques which are capable of forming the planar structure shown in FIG. 1(c). Specifically, chemical mechanical polishing or etching can be employed in the present invention so as to remove metallic nitride layer 24, doped polysilicon layer 22 and node dielectric layer 20 that are formed over the semiconductor substrate stopping at pad layers 14.

Figure 1D:
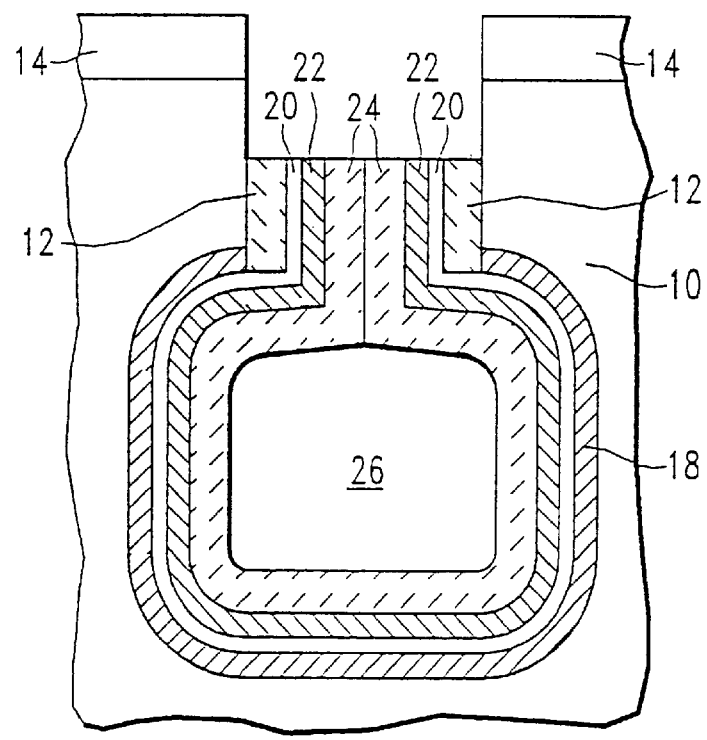

After planarization, the deep trench is recessed, as shown in FIG. 1(d), so as to remove a portion of node dielectric layer 20, doped polysilicon 22, metallic nitride layer 24, and if present, collar oxide 12 from the upper region of trench 16. The recess process may be carried out utilizing any suitable conventional anisotropic or isotropic etching process. Alternatively, a combination of anisotropic and isotropic etching may be used to recess the various materials from the upper region of the trench. Examples of suitable etching techniques that can be employed in the present invention, include: ion enhanced etching, ion induced etching, plasma etching, reactive ion etching, reactive ion-beam etching, microwave plasma etching, chemical etching, wet etching or other like etching techniques. The recess is preferably performed by a plasma etching process utilizing a halogen such as chlorine or fluorine as a reactive etching gas.

Figure 1E:
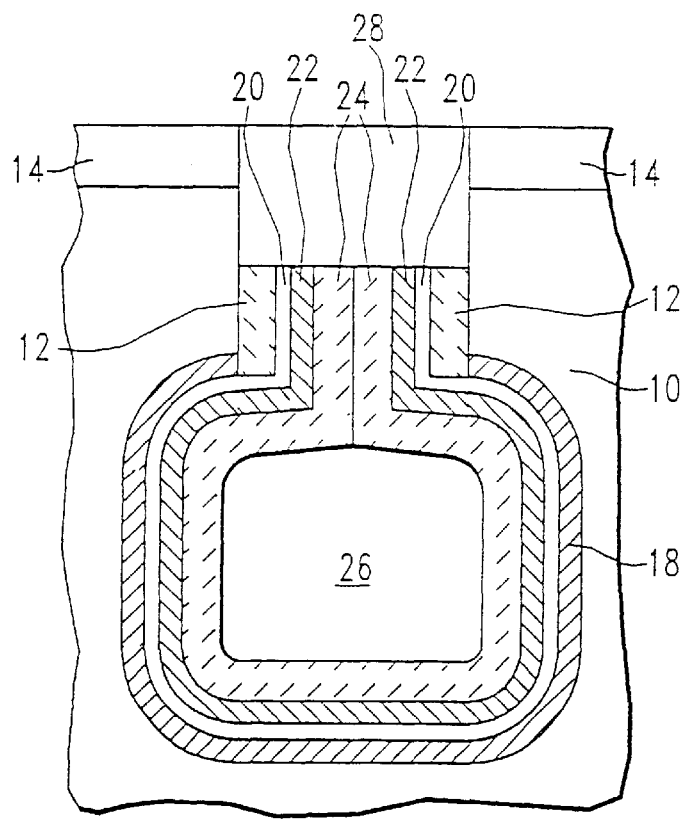

After recessing some of the material from a portion of the upper region of the trench, the recess area of the trench capacitor structure is then filled with amorphous silicon 28 utilizing conventional deposition processes well known to those skilled in the art. The amorphous silicon may be undoped or doped with a specific dopant type which is the same as the source/drain diffusions of the array MOSFETs. If undoped, the amorphous silicon may be subsequently doped by a variety of processes well known to those skilled in the art. The structure thus obtained is then planarized by conventional planarization techniques like the ones mentioned above. The planarized filled trench capacitor structure is shown in FIG. 1(e).

The capacitor structure of the present invention containing a metallic nitride as part of a capacitor electrode in the lower region of the trench has substantially reduced series resistance as compared to comparable structures that do not contain such a metallic nitride layer therein. Typically, the present invention is capable of reducing the series resistance caused by the deep trench as much as 1000× for a given trench geometry/ground rule. Alternatively, the present invention may be used to create capacitor structures with even smaller ground rules which have series resistance similar to wider capacitors.

Figure 2:
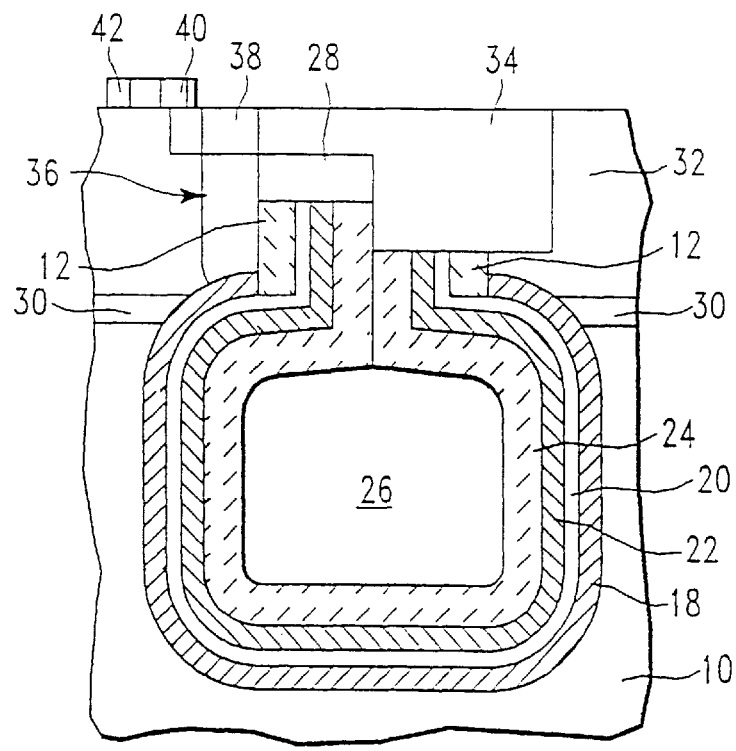
FIG. 2 is a schematic cross-sectional view of an advanced memory cell which can be fabricated from the capacitor structure shown in FIG. 1(*e*).

The capacitor structures of the present invention may be used in DRAM memory cells such as the one shown in FIG. 2 or in other integrated circuit devices. Specifically, the memory cell in FIG. 2 comprises the capacitor structure shown in FIG. 1(e) as well as n-band region 30, p-well 32, shallow trench isolation region 34, buried strap region 36, array implant 38, gate conductor region 40 and array conductor region 42.

The memory cell device shown in FIG. 2 may be fabricated utilizing the method of the present invention in combination with other manufacturing steps to form shallow trench isolation, gate conductor regions and other memory cell components, which other manufacturing steps are well known to those skilled in the art. The formation of n-band regions is discussed in European Published Patent Application 822599, published Feb. 4, 1998, the disclosure of which is incorporated herein by reference. Examples of those manufacturing steps are disclosed in the above mentioned Patent documents and/or are otherwise known to those skilled in the art.

In addition to memory cells and the manufacture thereof, the capacitor structures and manufacturing techniques of the present invention may also be useful in conjunction with other integrated device structures and device manufacturing techniques.

While this invention has been particularly shown and described with respect to preferred embodiments thereof, it will be understood by those skilled in the art that the foregoing and other changes in forms and details may be made without departing from the spirit and scope of the present invention.

What is claimed is:

1. A process of fabricating a deep trench capacitor structure, said process comprising the steps of:

(a) providing a semiconductor substrate having (i) a deep trench region therein, said deep trench having an upper region and a lower region, (ii) at least one pad layer formed on a surface of said semiconductor substrate, said pad layer being adjacent to said deep trench region, (iii) a first node electrode in said semiconductor substrate about said lower region of said deep trench, and (iv) a conformal node dielectric lining said deep trench at said first node electrode;

(b) forming a doped polysilicon on said node dielectric;

(c) forming a layer of a metallic nitride on said doped polysilicon;

(d) planarizing the structure resulting from step (c) stopping at said pad layer;

(e) removing said node dielectric, said doped polysilicon and said metallic nitride from a portion of said upper region of said deep trench to form a recess;

(f) filling said recess formed in step (e) with amorphous silicon; and (g) planarizing said structure formed in step (f) stopping at said pad layers.

2. The method of claim 1 wherein said semiconductor substrate is Si.

3. The method of claim 1 wherein said first node electrode is an out-diffused buried plate.

4. The method of claim 1 wherein a collar oxide is provided about the upper region of said trench prior to step (b).

5. The method of claim 1 wherein step (c) is carried out by a deposition process selected from the group consisting of chemical vapor deposition (CVD) and low pressure chemical vapor deposition (LPCVD).

6. The method of claim 1 wherein said metallic nitride has a resistivity of from about 1 to about 1000 $\mu$ohm-cm.

7. The method of claim 1 wherein said metallic nitride is TiN, TaN, TaSiN or WN.

8. The method of claim 1 wherein said metallic nitride is TiN.

9. The method of claim 1 wherein a void is formed during step (c).

10. The method of claim 1 wherein step (d) is carried out by chemical mechanical polishing or etching.

11. The method of claim 1 wherein step (e) is a selective recess etch process selected from the group consisting of anisotropic etching, isotropic etching and a combination thereof.

12. The method of claim 11 wherein said selective etch is performed by ion enhanced etching, ion induced etching, plasma etching, reactive ion etching, reactive ion-beam etching or microwave plasma etching.

13. The method of claim 1 wherein step (e) is carried out by plasma etching utilizing a halogen as a reactive plasma gas.

14. The method of claim 1 wherein step (f) is carried by CVD, LPCVD and plasma-assisted CVD.

15. The method of claim 1 wherein step (g) is carried out by chemical mechanical polishing or etching.

16. The method of claim 1 wherein said deep trench has a depth of from about 3 to about 10 µm.

17. The method of claim 1 wherein said upper region of said trench is narrow as compared with the lower region of said trench.

18. The method of claim 1 wherein said amorphous silicon layer is doped or undoped with a dopant atom.

19. A process of fabricating a deep trench capacitor structure, said process comprising the steps of:

(a) providing a semiconductor substrate having (i) a deep trench region therein, said deep trench having an upper region and a lower region, (ii) at least one pad layer formed on a surface of said semiconductor substrate, said pad layer being adjacent to said deep trench region, (iii) a first node electrode in said semiconductor substrate about said lower region of said deep trench, and (iv) a conformal node dielectric lining said deep trench at said first node electrode;

(b) forming a doped polysilicon on said node dielectric;

(c) forming a layer of a metallic nitride on said doped polysilicon;

(d) planarizing the structure resulting from step (c) stopping at said pad layer;

(e) plasma etching said node dielectric with a halogen as a reactive gas, said doped polysilicon and said metallic nitride from a portion of said upper region of said deep trench to form a recess;

(f) filling said recess formed in step (e) with amorphous silicon; and (g) planarizing said structure formed in step (f) stopping at said pad layers.

* * * * *

UNITED STATES PATENT AND TRADEMARK OFFICE
CERTIFICATE OF CORRECTION

PATENT NO. : 6,258,689 B1  
DATED : July 10, 2001  
INVENTOR(S) : Gary B. Bronner et al.

Page 1 of 1

It is certified that error appears in the above-identified patent and that said Letters Patent is hereby corrected as shown below:

<u>Column 1,</u>  
Line 3, insert -- RELATED APPLICATION --

Signed and Sealed this

Thirtieth Day of April, 2002

Attest:

Attesting Officer

JAMES E. ROGAN  
*Director of the United States Patent and Trademark Office*